(12) United States Patent
Ahn (10) Patent No.: US 6,496,554 B1
(45) Date of Patent: Dec. 17, 2002

(54) PHASE LOCK DETECTION CIRCUIT FOR PHASE-LOCKED LOOP CIRCUIT

(75) Inventor: Tae-Won Ahn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/294,466

(22) Filed: Apr. 20, 1999

(30) Foreign Application Priority Data

Apr. 20, 1998 (KR) .............................. 98-14009

(51) Int. Cl.$^7$ ................................ H03L 7/095
(52) U.S. Cl. ................. 375/376; 331/DIG. 2; 327/156
(58) Field of Search ................ 375/374, 375, 375/376, 327, 344; 331/25, 1 A, DIG. 2; 329/307; 327/156, 157, 161

(56) References Cited

U.S. PATENT DOCUMENTS

| | | | | |
|---|---|---|---|---|
| 5,278,520 A | * | 1/1994 | Parker et al. | 331/1 A |
| 5,394,444 A | * | 2/1995 | Silvey et al. | 327/156 |
| 5,459,755 A | * | 10/1995 | Iga et al. | 375/374 |
| 5,886,582 A | * | 3/1999 | Stansell | 327/143 |
| 5,973,572 A | * | 10/1999 | Ukita | 327/5 |
| 6,177,842 B1 | * | 1/2001 | Anh et al. | 327/156 |
| 6,226,339 B1 | * | 5/2001 | Nam et al. | 327/157 |

* cited by examiner

*Primary Examiner*—Amanda T. Le
(74) *Attorney, Agent, or Firm*—F. Chau & Associates, LLP (57) ABSTRACT

The present invention relates to a phase-locked loop (PLL) circuit and, more particularly to a PLL with a phase lock detection circuit. The PLL circuit includes a phase detector, a charge pump, a loop filter, a voltage controlled oscillator (VCO), a frequency divider, and a phase lock detection circuit having two current charging/discharging circuits with first and second constant current sources for generating a phase lock signal having a pulse form through charging/discharging a capacitor. A voltage level of the capacitor is changed with a hysteresis characteristic. In the out-of-lock state of the PLL circuit, the discharging speed of the capacitor is faster than the charging speed thereof. In the phase lock state of the PLL circuit, the charging speed of the capacitor is faster than the discharging speed thereof. Since the charging/discharging operation of the capacitor is executed linearly and symmetrically, the phase lock detection circuit according to the present invention can obtain stable phase lock information. In addition, it is able to forecast the result of the phase lock state apart from a process variation by using the current mirror.

20 Claims, 5 Drawing Sheets

PHASE LOCK DETECTION CIRCUIT FOR PHASE-LOCKED LOOP CIRCUIT

FIELD OF THE INVENTION

The present invention relates to a phase-locked loop (PLL) circuit and, more particularly, to a PLL with a phase lock detection circuit.

BACKGROUND OF THE INVENTION

Phase-locked loops (PLLs) are found in a myriad of electronic applications such as communication receivers and clock synchronization circuits for computer systems. A conventional PLL includes a phase detector for monitoring the phase difference between an input signal and an output signal of a voltage controlled oscillator (VCO) and generating an up control signal and a down control signal for a charge pump circuit which charges and discharges the loop filter at the input of the VCO. The up and down control signals drive the VCO to maintain a predetermined phase relationship between the signals applied to a phase detector, as is well understood.

It is common for the PLL to lose phase lock should the input signal fade or jump to a radically different frequency of operation. The out-of-lock state can be detected with a detection circuit and the system processing suspended until the PLL can re-achieve phase lock. Most, if not all, such lock detection schemes monitor the up control signal and the down control signal at the output of the phase detector to ascertain the lock status of the PLL. If the up control signal and down control signal are not pulsing, then loop node voltage remains substantially constant and the PLL should be in phase lock. When the up control signal and the down control signal are steadily generating pulses charging or discharging the loop filter to adjust the input voltage of the VCO, the loop must be in motion and thus out of phase lock.

During normal operation, the loop node is continuously subjected to leakage through the charge pump circuit thus requiring occasional pulses to maintain the voltage controlling the VCO. However, these intermittent pulses should not indicate an out-of-lock state. The conventional detection circuit typically includes a delay circuit comprising, for example, a string of serially coupled inverters designed to ignore short intermittent pulses from the phase detector having less than a predetermined pulse width. The up and down control signals must have a pulse width as least as long as the delay circuit to trigger an out-of-lock signal. Unfortunately, the pulse widths of the up and down control signals are subject to temperature and process variation and therefore are not well suited as control parameters for ascertaining phase lock. The pulse widths of the up and down control signals are merely rough indicators having limited accuracy of the true phase relationship between the input signals of the phase detector.

Hence, what is needed is an improved detection circuit for a PLL which directly monitors the input signals of the phase detector to determine the lock status of the loop.

SUMMARY OF THE INVENTION

It is therefore an object of the present invention to provide a phase lock detection circuit for a PLL circuit in order to supply stable phase lock information.

To attain the above and other objects, according to an aspect of the present invention there is provided a phase lock detection circuit including: a capacitor; a first constant current source for supplying a first constant current; a second constant current source for supplying a second constant current corresponding to M-times (M is an integer of two and more) the first constant current; a window signal generating circuit responsive to the output signal, for generating a window signal which has a pulse width corresponding to an acceptable phase error; a delay circuit for delaying the input signal; a detection circuit for detecting whether the delayed input signal is within the pulse width of the window signal or not and generating a detection signal as a detection result; a first circuit for supplying the first constant current as a charging source of the capacitor or providing a discharge path thereto in response to both a control signal and the detection signal during a first state when the input and output signals are not phase locked; a second circuit for supplying the second constant current as a charging source of the capacitor or providing the discharge path thereto in response to both the control and detection signals during a second state when the input and output signals are phase locked; and a first inverter coupled to the capacitor, for outputting the control signal in accordance with a voltage level developed across the capacitor, wherein during the first state, a charging time of the capacitor is longer than a discharging time thereof, and during the second state, the charging time of the capacitor is more short than the discharging time thereof.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF PREFERRED EMBODIMENTS

Figure 1:
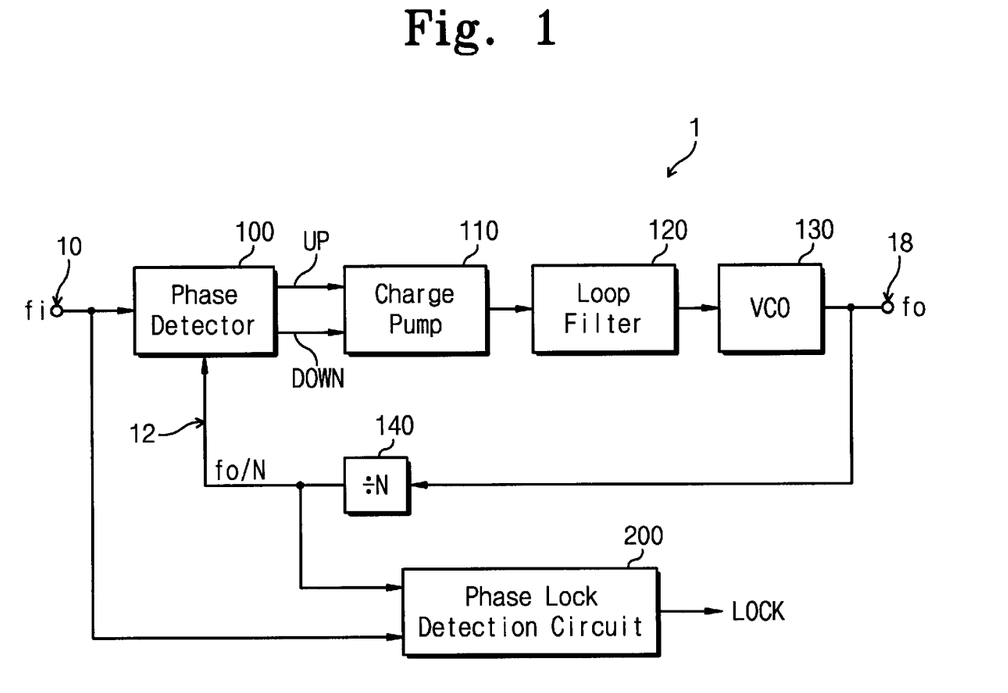
FIG. 1 is a block diagram illustrating a PLL circuit with a phase lock detection circuit according to the present invention.

A phase-locked loop circuit 1 with a phase lock detection circuit 200 in accordance with the present invention is shown in FIG. 1. A reference input fi at a terminal 10 provides a stable source of signal. For example, a crystal controlled oscillator(not shown) can be coupled to the terminal 10. A phase detector 100 compares the reference input fi with a divided output signal of/N in order to produce an up control signal and a down control signal. The up and down control signals are supplied to a charge pump 110 to source current or sink current. A loop filter 120 supplies a control voltage to a voltage controlled oscillator (VCO) 130. Thus, an output signal of at a terminal 18 represents an output of the VCO 130. A frequency divider 140 is programmed to produce a division ratio of N.

The phase lock detection circuit 200 is coupled to the nodes 10 and 12. The phase lock detection circuit 200 generates a phase lock signal LOCK in response to the input signal fi and the divided output signal of/N, wherein the phase lock signal LOCK indicates whether the PLL circuit 1 is in the out-of-lock state or in the phase lock state. In an electronic system using the PLL circuit 1 according to the present invention, the output signal of of the PLL circuit 1 is available during the phase lock state.

Figure 2:
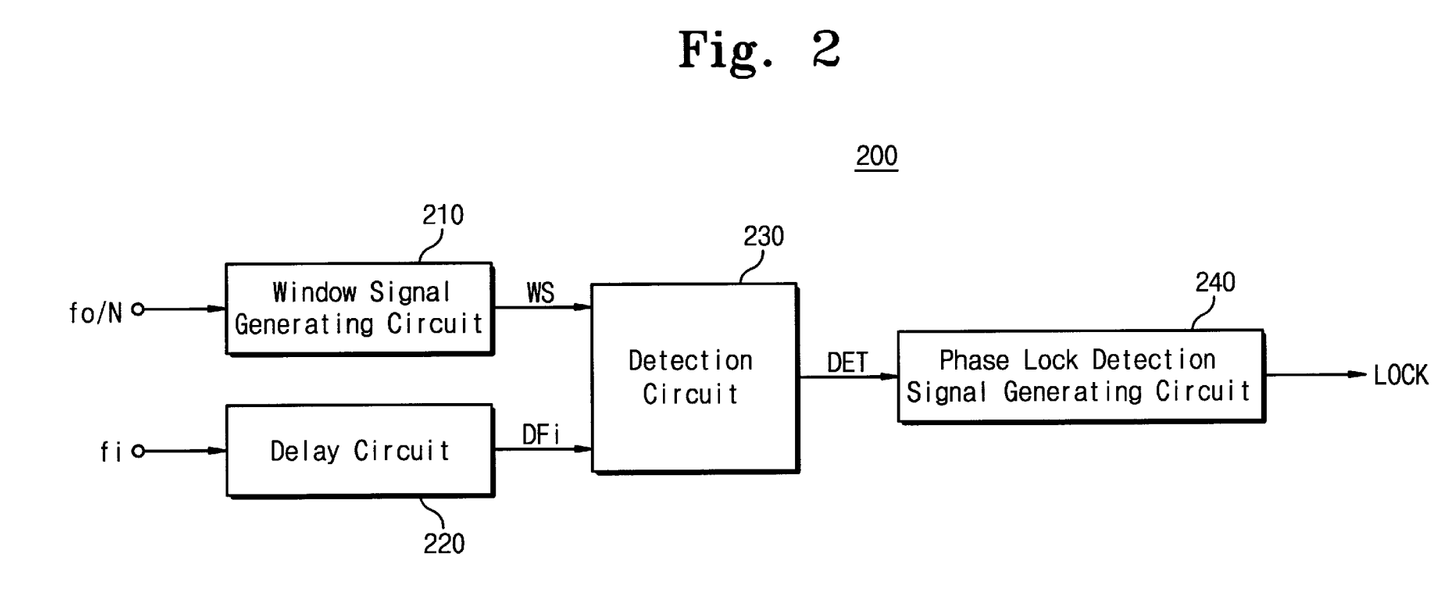
FIG. 2 is a block diagram illustrating the phase lock detection circuit according to the present invention.

FIG. 2 is a block diagram illustrating the phase lock detection circuit according to the present invention. Referring to FIG. 2, the phase lock detection circuit 200 comprises a window signal generating circuit 210, a delay circuit 220, a detection circuit 230, and a phase lock detection signal generating circuit 240. The window signal generating circuit 210 generates a window signal WS having a pulse width in accordance with an acceptable phase error in response to the divided output signal of/N. The delay circuit 220 outputs a delayed input signal DFi obtained by delaying the input signal fi. The detection circuit 230 detects whether a rising edge or a falling edge of the delayed input signal DFi exists in the pulse width of the window signal WS, and outputs a detection signal DET as a result. The phase lock signal generating circuit 240 generates the phase lock signal LOCK in response to the detection signal DET when the input signal fi and the divided output signal of/N are locked in phase during an appointed time.

Figure 3:
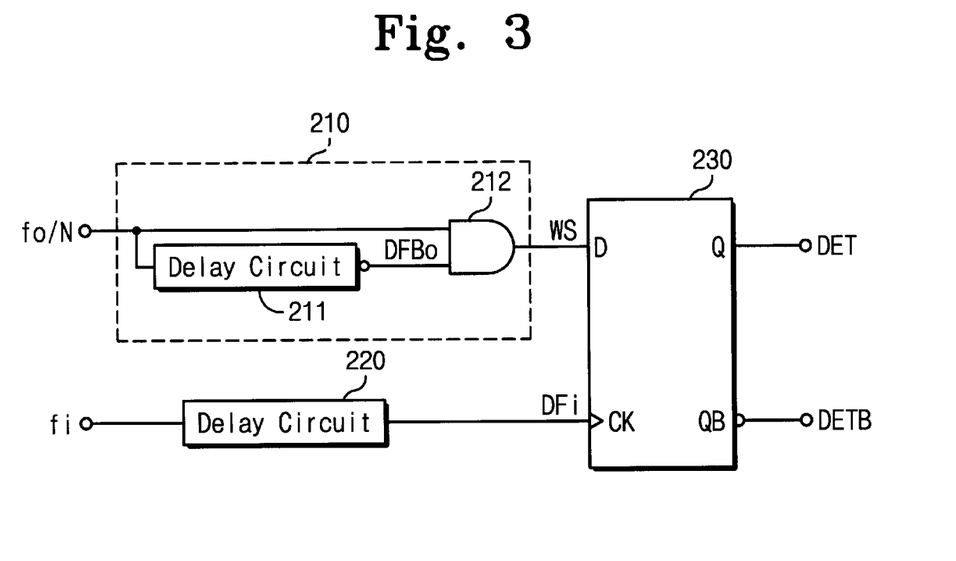
FIG. 3 is a schematic diagram illustrating a window signal generating circuit and a lock detection circuit shown in FIG. 2.
Figure 4:
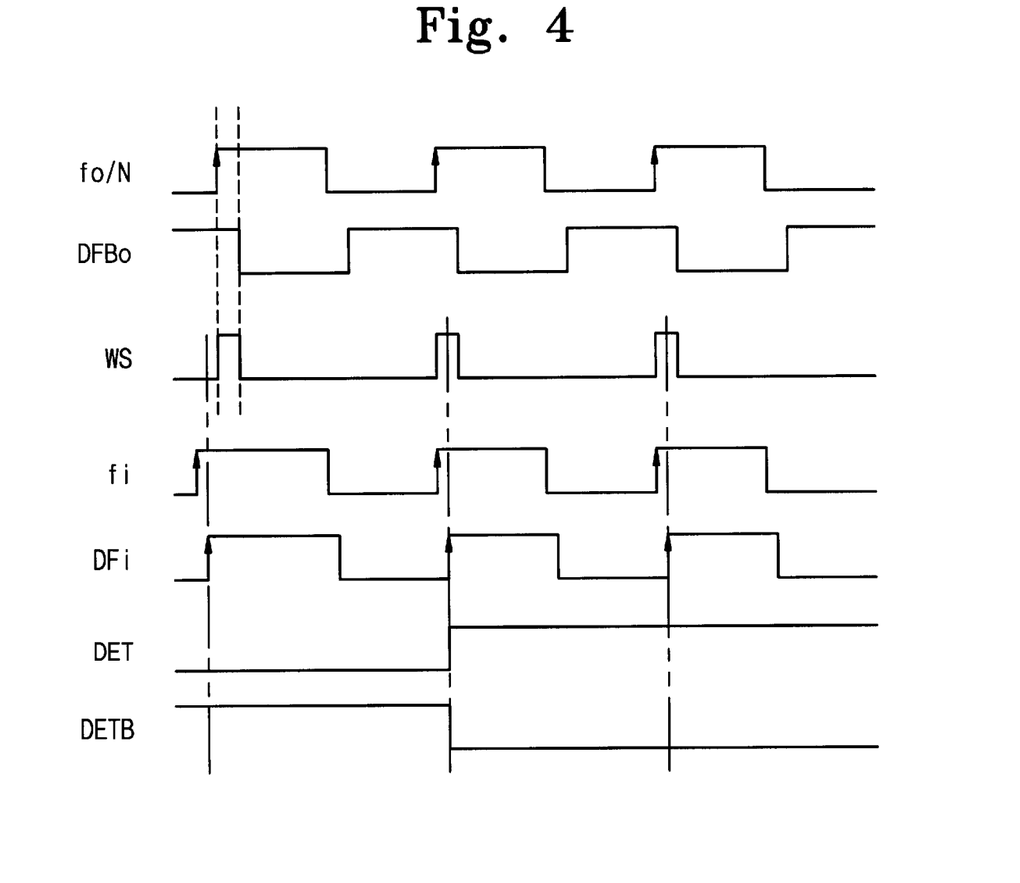
FIG. 4 is a waveform diagram illustrating the lock detection of the window signal and the delayed input signal by the detection circuit shown in FIG. 3.

FIG. 3 is a schematic diagram illustrating the window signal generating circuit and the lock detection circuit. FIG. 4 is a waveform diagram illustrating the lock detection of the window signal and the delayed input signal by the detection circuit shown in FIG. 3. Referring to FIG. 3 and FIG. 4, the phase lock detection is illustrated as follows.

First of all, the window signal generating circuit 210 comprises a delay circuit 211 and an AND gate 212. The delay circuit 211 delays and inverts the divided output signal of/N. The AND gate 212 generates the window signal WS as shown in FIG. 4 in response to the divided output signal of/N and an output signal DFBo of the delay circuit 211. The pulse width of the window signal WS corresponds to an acceptable phase error of the PLL circuit 1. At the same time, the delay circuit 220 delays the input signal fi and outputs the delayed input signal DFi as a result. The delay time $T_1$ of the input signal fi is assigned to half of the delay time $T_2$ of the window signal. Thus, preferably $T_1=T_2/2$. The detection circuit 230 is composed of a flip-flop having a first input terminal D for receiving the window signal WS, a clock terminal CK for receiving the delayed input signal DFi, a first output terminal Q for outputting the detection signal DET and a second output terminal QB for outputting a reverse detection signal DETB. The flip-flop of the detection circuit 230 latches the window signal WS at the rising edge of the delayed input signal DFi. At the rising edge of the delayed input signal DFi, if the window signal WS is a logic low level ("0"), then the detection signal DET of the flip-flop becomes the logic low level ("0"). It means that the input signal fi and the divided output signal of/N are in the out-of-lock state. Similarly, at the rising edge of the delayed input signal DFi, if the window signal WS is a logic high level ("1"), then the detection signal DET of the flip-flop becomes the logic high level ("1"). It means that the input signal fi and the divided output signal of/N are in the phase lock state.

Figure 5:
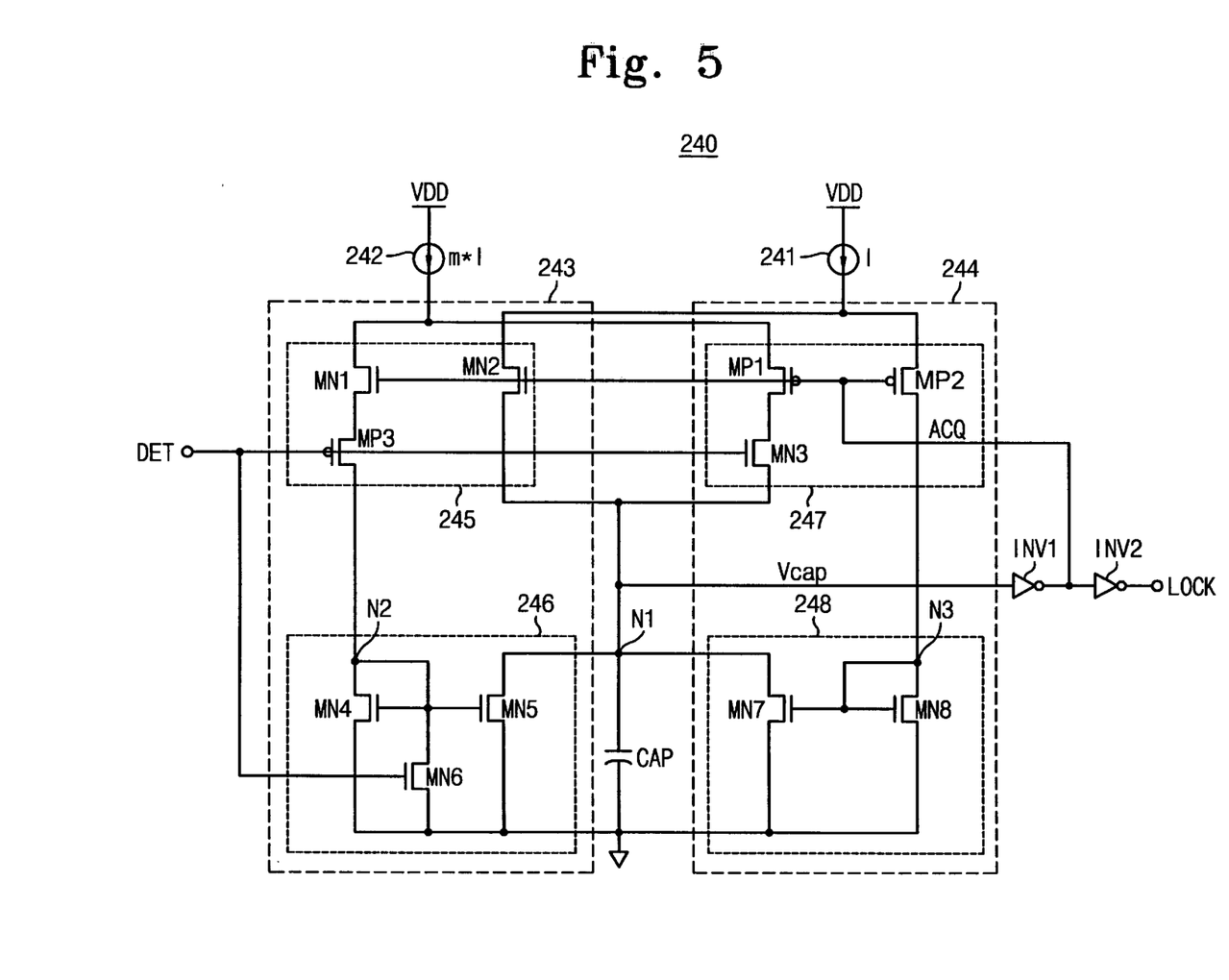
FIG. 5 is a schematic diagram illustrating a phase lock signal generating circuit according to the present invention.

FIG. 5 is a schematic diagram illustrating the phase lock signal generating circuit according to the present invention. Referring to FIG. 5, the phase lock detection circuit 240 comprises a capacitor CAP, a first constant current source 241 for supplying a first constant current I, a second constant current source 242 for supplying a second constant current m*I in accordance with m (more than 2) times as much as the first constant current I, a first inverter INV1 coupled to the capacitor CAP for outputting a switching control signal ACQ, and a second inverter INV2 coupled to the first inverter INV1 for outputting the phase lock signal LOCK, wherein the phase lock signal LOCK is the same as the inverted switching control signal ACQ. In addition, the phase lock detection circuit 240 comprises a first charging/discharging circuit 243 and a second charging/discharging circuit 244.

The first charging/discharging circuit 243 comprises a switch circuit 245 and a current mirror 246 operating in response to the detection signal DET and the switching control signal ACQ. The switching control signal ACQ corresponds to the inverted phase lock signal LOCK which is the output signal of the phase lock detection circuit 200. As such, the first inverter INV1 can be composed of an inverter having a hysteresis characteristic or a CMOS inverter. The switch circuit 245 comprises two NMOS transistors MN1 and MN2, and a PMOS transistor MP3. The transistors MN1 and MP3 have current paths formed between the second constant current source 242 and a second node N2 in series, and gates controlled by the switching control signal ACQ and the detection signal DET, respectively. The NMOS transistor MN2 has a current path formed between the first constant current source 241 and a first node N1 of the capacitor CAP, and a gate controlled by the switching control signal ACQ. The current mirror 246 comprises three NMOS transistors MN4, MN5 and MN6. The NMOS transistor MN4 has a current path formed between the second node N2 and a ground voltage, and a gate coupled to the second node N2. The NMOS transistor MN5 has a current path formed between the first node N1 of the capacitor CAP and the ground voltage, and a gate coupled commonly with the second node N2 and the gate of the transistor MN4. The NMOS transistor MN6 has a current path formed between the ground voltage and the second node N2 which coupled commonly with the gates of the NMOS transistors MN4 and MN5, and a gate controlled by the detection signal DET.

The second charging/discharging circuit 244 comprises a switch circuit 247 and a current mirror 248. The switch circuit 247 has two PMOS transistors MP1 and MP2, and an NMOS transistor MN3. The current mirror 248 has two NMOS transistors MN7 and MN8. The transistors MP1 and MN3 have current paths formed between the second constant current source 242 and the first node N1 of the capacitor CAP, and gates controlled by the switching control signal ACQ and the detection signal DET, respectively. The PMOS transistor MP2 has a current path formed between the first constant current source 241 and a third node N3, and a gate controlled by the switching control signal ACQ. The NMOS transistors MN7 and MN8 of the current mirror 248 have current paths formed between the first node N1 and the ground voltage, and the third node N3 and the ground voltage, respectively. The NMOS transistors MN7 and MN8 have gates commonly coupled to the third node N3.

Figure 6:
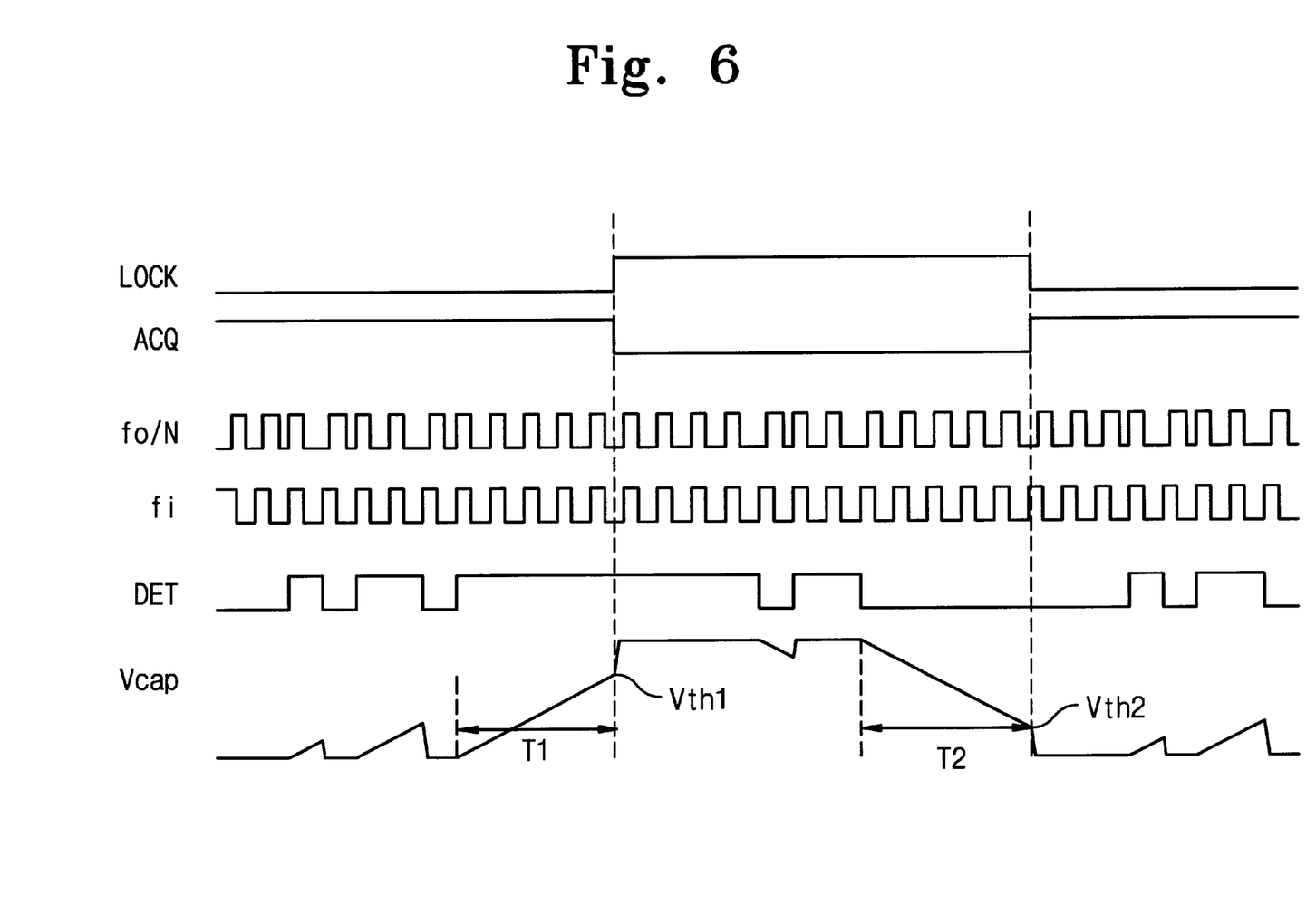
FIG. 6 is a waveform diagram illustrating the phase lock operation.

FIG. 6 is a waveform diagram illustrating the phase lock operation of the input signal fi and the-divided output signal of/N.

In the initial state of the; PLL circuit 1, since the capacitor CAP is not charged yet, the phase lock signal LOCK is set into the logic low level ("0"). Thus, the out-of-lock state is detected. In the initial state, the switching control signal ACQ is set into the logic high level ("1"). In the switch circuits 245 and 247, the NMOS transistors MN1 and MN2 are turned on and the PMOS transistors MP1 and MP2 are turned off in response to the switching control signal ACQ. In that case, if the input signal fi and the divided output signal of/N are unlocked in phase, the detection signal DET becomes the logic low level ("0"). Thus, the PMOS transistor MP3 is turned on and the NMOS transistor MN3 is turned off, respectively.

The discharging operation of the capacitor CAP is executed when the switching control signal ACQ has the logic high level ("1") and the detection signal DET has the logic low level ("0"), respectively. Although the capacitor CAP is charged with the first constant current I through the turned on: NMOS transistor MN2, the capacitor CAP is discharged with the second constant current m*I. The reason for this will now be given. When the capacitor CAP is charged with the first constant current I, the second node N2 is charged with the second constant current m*I through the transistors MN1 and MN3, so that the current m*I flows through the NMOS transistor MN5 of the current mirror 246. Thus, the capacitor CAP is discharged with the second constant current m*I through the NMOS transistor MN5. Thus, the amount of the discharged current of the capacitor CAP is (m−1)*I. In other words, the capacitor CAP is discharged on a slant (m−1)/C (where C is a capacity of the capacitor CAP). As a result, the voltage level of the capacitor Vcap is maintained 0V.

Next, as shown in FIG. 6, during the. out-of-lock state, if the input signal fi and the divided output signal of/N are locked in phase, the detection signal DET is set into the logic high level("1") , so that the capacitor CAP is charged. The charging operation of the capacitor CAP will now be described in further detail. The PMOS transistor MP3 is turned off and the NMOS transistors MN3 and MN6 are turned on, in response to the detection signal DET, so that the current mirror 246 becomes non-activated. Thus, the capacitor CAP is charged gradually by the first constant current I through the NMOS transistor MN2. The voltage level of the capacitor Vcap is increased on the slant 1/C (where, C is a capacity of the capacitor CAP). In addition, during the out-of-lock state, if the input signal fi and the divided output signal of/N are unlocked in phase, then the capacitor CAP is discharged; if the input signal fi and the divided output signal of/N are locked in phase, then the capacitor CAP is charged. In the out-of-lock state, if the input signal fi and the divided output signal of/N are locked during a prescribed time T1, the switching control signal ACQ becomes the logic low level ("0") and the phase lock signal LOCK becomes the logic high level ("1") illustrating the phase lock state. It is obvious to one skilled in the art that the time T1 is predetermined by a PLL system designer. The capacity of the capacitor CAP and/or a first threshold voltage of the capacitor Vth1 can be predetermined in order to generate the phase lock signal LOCK for indicating validity of the output signal of when the input signal fi and the divided output signal of/N are continually locked during the time T1.

Otherwise, once converted to the phase lock state, the charging/discharging path is converted in opposition to the out-of-lock state. In other words, since the switching control signal ACQ is converted from the logic high level to the logic low level, the NMOS transistors MN1 and MN2 are turned off and the PMOS transistors MP1 and MP2 are turned on. Thus, the current mirror 246 is non-activated and the other current mirror 248 is activated. In the phase lock state, if the detection signal DET becomes the logic low level, i.e., if the input signal fi and the divided output of/N are unlocked in phase, the capacitor CAP is discharged with the first constant current I through the NMOS transistor MN7.

Next, during the phase lock state, if the input signal fi and the divided output signal of/N are locked in phase, the detection signal DET is set into the logic high level ("1"), so that the capacitor CAP is charged. The capacitor CAP is charged with the second constant current m*I through the PMOS transistor MP1 and the NMOS transistor MN3 of the switch circuit 247. In that case, the capacitor CAP is discharged by the current mirror 248 that the discharged current of the capacitor CAP is the first constant current I. Thus, the amount of the charged current of the capacitor CAP is (m−1)*I. In addition, in the phase lock state, if the input signal fi and the divided output signal of/N are unlocked during a prescribed time T2, i.e., if the voltage level of the capacitor Vcap is lower than a second threshold voltage Vth2, the switching control signal ACQ becomes the logic high level and the phase lock signal LOCK becomes the logic low level , so that the out-of-lock state is detected. Thus, the charging/discharging; path is converted in opposition to the phase lock state.

As mentioned above, in the out-of-lock state, the capacitor CAP is charged by the first constant current source 241 with the first constant current I and discharged by the second constant current source 242 with the second constant current m*I. During the out-of-lock state of the PLL circuit 1, the discharging speed of the capacitor CAP is faster than the charging speed thereof. On the other hand, in the phase lock state, the capacitor CAP is charged by the second constant current source 242 with the second constant current m*I and discharged by the first constant current source 241 with the first constant current 1. During the phase lock state of the PLL circuit 1, the charging speed of the capacitor CAP is faster than the discharging speed thereof.

As a result, when the lock state is converted from the out-of-lock state to the phase lock state, or converted from the phase lock state to the out-of-lock state, the voltage level of the capacitor Vcap is changed with the hysteresis characteristic. Since the charging/discharging operation of the capacitor CAP is executed linearly and symmetrically, the phase lock detection circuit according to the present invention can obtain stable phase lock information. In addition, it is able to forecast the result of the phase lock state apart from a process variation by using the current mirror.

Although the invention has been described and illustrated in the above description and drawings, it is understood that this description is by example only. For example, the temperature sensor can be any element whose characteristics vary predictively with temperature. Numerous changes and modifications can be made by those skilled in the art without departing from the true spirit and scope of the invention.

What is claimed is:

1. A phase lock detection circuit for detecting when an output signal of a phaselocked loop circuit is phase locked to an input signal thereof, the phase lock detection circuit comprising:
   a capacitor;
   a first constant current source for supplying a first constant current;
   a second constant current source for supplying a second constant current corresponding to M-times the first constant current, wherein M is an integer one of greater than and equal to two;

a window signal generating circuit responsive to the output signal, for generating a window signal having a pulse width corresponding to an acceptable phase error;

a delay circuit for delaying the input signal;

a detection circuit for detecting whether the delayed input signal is within the pulse width of the window signal and generating a detection signal as a detection result;

first means for supplying the first constant current as a charging source of the capacitor or providing a discharge path for the capacitor in response to both a control signal and the detection signal during a first state when the input and output signals are not phase locked;

second means for supplying the second constant current as a charging source of the capacitor or providing the discharge path for the capacitor in response to both the control and detection signals during a second state when the input and output signals are phase locked; and a first inverter coupled to the capacitor, for outputting the control signal in accordance with a voltage level developed across the capacitor, wherein during the first state a charging time of the capacitor is greater than a discharging time thereof, and during the second state the charging time of the capacitor is less than the discharging time thereof.

2. The phase lock detection circuit according to claim 1, wherein during the first state, an amount of current discharged through the discharge path provided by the first means corresponds to the second constant current.

3. The phase lock detection circuit according to claim 2, wherein the first means comprises:

a switch circuit for supplying the first constant current as the charging source of the capacitor in response to the control signal when the detection signal is generated, and transferring the second constant current in response to the control signal when the detection signal is not generated; and a current mirror coupled to the capacitor, for providing the discharge path of the capacitor during the first state.

4. The phase lock detection circuit according to claim 3, wherein the switch circuit comprises:

a first NMOS transistor:having a current path formed between the first constant current source and the capacitor, and a gate responsive to the control signal;

a second NMOS transistor having a drain coupled to the second constant current source, a gate responsive to the control signal, and a source; and a PMOS transistor having a current path formed between the source of the second NMOS transistor and the current mirror, and a gate responsive to the detection signal.

5. The phase lock detection circuit according to claim 3, wherein the current mirror comprises:

a first NMOS transistor having a drain coupled to the capacitor, a source coupled to a ground, and a gate;

a second NMOS transistor having a drain coupled to the switch circuit, a source coupled to the ground, and a gate coupled to the gate of the first NMOS transistor; and a third NMOS transistor having a current path formed between the ground and a node operatively coupled to the gates of the first and the second NMOS transistors, and a gate responsive to the detection signal.

6. The phase lock detection circuit according to claim 3, wherein said switch circuit transfers the second constant current to the current mirror in response to the control signal when the detection signal is not generated.

7. The phase lock detection circuit according to claim 1, wherein during the second state, an amount of current discharged through the discharge path provided by the second means corresponds to the first constant current.

8. The phase lock detection circuit according to claim 7, wherein the second means comprises:

a switch circuit for supplying the second constant current as the charging source of the capacitor in response to the control signal when the detection signal is generated, and transferring the first constant current in response to the control signal when the detection signal is not generated; and a current mirror coupled to the capacitor, for providing the discharge path of the capacitor during the second state.

9. The phase lock detection circuit according to claim 8, wherein the switch circuit comprises:

a first PMOS transistor having a source coupled to the second constant current source, a gate responsive to the control signal, and a drain;

an NMOS transistor having a current path formed between the drain of the first PMOS transistor and the capacitor, and a gate responsive to the detection signal; and a second PMOS transistor having a current path formed between the first constant current source and the current mirror, and a gate responsive to the control signal.

10. The phase lock detection circuit according to claim 8, wherein the current mirror comprises:

a first NMOS transistor having a current path formed between the switch circuit and a ground, and a gate; and a second NMOS transistor having a current path formed between the capacitor and the ground, and a gate coupled to the gate of the first NMOS transistor.

11. The phase lock detection circuit according to claim 8, wherein said switch circuit transfers the first constant current to the current mirror in response to the control signal when the detection signal is not generated.

12. The phase lock detection circuit according to claim 1, wherein the first inverter has a hysteresis characteristic.

13. The phase lock detection circuit according to claim 12, further comprising a second inverter coupled to the first inverter, for outputting a phase lock signal as an inverted signal of the control signal and as an output signal of the phase lock detection circuit.

14. The phase lock detection circuit according to claim 1, wherein the window signal generating means comprises:

means for delaying the output signal and inverting the delayed output; and an AND gate having a first input terminal for receiving the output signal, a second input terminal for receiving the delayed and inverted output signal, and an output terminal for outputting the window signal.

15. The phase lock detection circuit according to claim 14, wherein a delay time of the input signal is half a delay time of the output signal.

16. A phase lock detection circuit for detecting when an output signal of a phaselocked loop circuit is phase locked to an input signal thereof, the phase lock detection circuit comprising:

a capacitor;

a first constant current source for supplying a first constant current;

a second constant current source for supplying a second constant current corresponding to M-times the first constant current, wherein M is an integer one of greater than and equal to two;

a window signal generating circuit for generating a window signal having a pulse width corresponding to an acceptable phase error in response to the output signal;

a delay circuit for delaying the input signal;

a detection circuit for detecting whether the delayed input signal is within the pulse width of the window signal and generating a detection signal as a detection result;

first means for charging and discharging the capacitor, said first means being responsive to a control signal and the detection signal during a first state when the input and output signals are not phase locked;

second means for charging and discharging the capacitor, said second means being responsive to the control and detection signals during a second state when the input and output signals are phase locked; and a first inverter coupled to the capacitor for outputting the control signal in accordance with a voltage level developed across the capacitor, wherein during the first state a charging time of the capacitor is greater than a discharging time thereof, and during the second state the charging time of the capacitor is less than the discharging time thereof.

17. The phase lock detection circuit according to claim 16, wherein the first means comprises:

a current mirror coupled to the capacitor, for providing a discharge path for the capacitor during the first state; and a switch circuit for supplying the first constant current to the capacitor in response to the control signal when the detection signal is generated, and transferring the second constant current to the current mirror in response to the control signal when the detection signal is not generated.

18. The phase lock detection circuit according to claim 17, wherein during the first state, an amount of current discharged through the discharge path provided by the current mirror corresponds to the second constant current.

19. The phase lock detection circuit according to claim 16, wherein the second means comprises:

a current mirror coupled to the capacitor, for providing a discharge path for the capacitor during the second state; and a switch circuit for supplying the second constant current to the capacitor in response to the control signal when the detection signal is generated, and transferring the first constant current to the current mirror in response to the control signal when the detection signal is not generated.

20. The phase lock detection circuit according to claim 19, wherein during the second state, an amount of current discharged through the discharge path provided by the current mirror corresponds to the first constant current.

* * * * *